(12) United States Patent
Osato et al.

(10) Patent No.: US 7,902,739 B2
(45) Date of Patent: Mar. 8, 2011

(54) ORGANIC LIGHT EMITTING DEVICE WITH PRISM

(75) Inventors: Yoichi Osato, Yokohama (JP); Hiroyuki Kitayama, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 367 days.

(21) Appl. No.: 11/691,138

(22) Filed: Mar. 26, 2007

(65) Prior Publication Data

US 2007/0230211 A1    Oct. 4, 2007

(30) Foreign Application Priority Data

Mar. 31, 2006 (JP) ................................. 2006-097176

(51) Int. Cl.
*H01J 5/16* (2006.01)
*H01L 51/52* (2006.01)
*H05B 33/02* (2006.01)

(52) U.S. Cl. ......... 313/501; 313/503; 313/506; 313/110; 313/112; 313/111

(58) Field of Classification Search .................. 362/600, 362/626
See application file for complete search history.

(56) References Cited

U.S. PATENT DOCUMENTS

| 3,705,758 | A | * | 12/1972 | Haskal ........................... 359/239 |
| 5,402,324 | A | | 3/1995 | Yokoyama et al. |
| 6,091,547 | A | * | 7/2000 | Gardiner et al. ............. 359/625 |
| 6,795,139 | B1 | | 9/2004 | Kameyama et al. |
| 2002/0000772 | A1 | | 1/2002 | Kitahara |
| 2002/0080598 | A1 | * | 6/2002 | Parker et al. .................... 362/31 |
| 2005/0213350 | A1 | * | 9/2005 | Tsuda et al. ................... 362/620 |
| 2007/0085476 | A1 | * | 4/2007 | Hirakata et al. .............. 313/506 |
| 2007/0230158 | A1 | | 10/2007 | Kitayama et al. |

FOREIGN PATENT DOCUMENTS

| JP | 7-1428 U | 1/1995 |
| JP | 11097169 | 4/1999 |
| JP | 2000-321431 A | 11/2000 |
| JP | 2002-006776 A | 1/2002 |
| JP | 2002216947 | 8/2002 |
| JP | 2004-054035 A | 2/2004 |
| JP | 2004070094 | 3/2004 |
| JP | 2005-055736 A | 3/2005 |
| JP | 2005-091825 A | 4/2005 |
| JP | 2005-173409 A | 6/2005 |
| JP | 2006-030289 A | 2/2006 |
| JP | 2006-066074 A | 3/2006 |

OTHER PUBLICATIONS

Machine translation of JP 2004-070094.*

* cited by examiner

*Primary Examiner* — Nimeshkumar D Patel
*Assistant Examiner* — Jacob Stern
(74) *Attorney, Agent, or Firm* — Fitzpatrick, Cella, Harper & Scinto

(57) ABSTRACT

An object of the present invention is to maintain sufficient light extraction from an organic light emitting device and reduce reflection of external light. There are arranged a polarizing member, a prism member, a phase member, and an organic light emitting element which has an organic light emitting layer arranged between a pair of electrodes, in mentioned order from the side of a light extraction surface. When the prism member includes two sheets, the vertex angle of the prism member sheet arranged on the side of the organic light emitting element is preferably a vertex or less of the prism member arranged on the side of the light extraction surface. Furthermore, the prism members are preferably arranged so that pitch directions thereof are orthogonal to each other.

10 Claims, 7 Drawing Sheets light extraction side pitch direction of prism member 12 stretching direction of the polarizing member

ORGANIC LIGHT EMITTING DEVICE WITH PRISM

BACKGROUND OF THE INVENTION

1. Field of the Invention

The present invention relates to an organic light emitting device which has an organic light emitting element, and an emissive display device using a plurality of organic light emitting elements. Particularly, the present invention relates to an organic light emitting device and display device which have enhanced light extraction efficiency from light emitting pixels.

2. Description of the Related Art

In emissive elements such as an organic EL element, a part of light emitted from the light emitting element, for example, incident light at an angle larger than the critical angle on an interface between an element substrate and air is totally reflected. Therefore, there has been a problem that only about 20% of the total emitted light could be actually extracted to the outside. Then, a technique for by forming irregularities on the light extraction surface of the light emitting element to enhance light extraction efficiency has been proposed.

As such a technique, a technique in which a circularly polarizing plate and a micro lens are stacked in this order on the surface of an organic EL display having a emissive light source has been disclosed (see Japanese Patent Application Laid-Open No. 2002-216947).

A technique in which a dual brightness enhancement film and a circularly polarizing plate are stacked in this order on the surface of an organic EL element having a emissive light source has been disclosed (see Japanese Patent Application Laid-Open No. 2004-070094).

However, since the organic EL display disclosed in Japanese Patent Application Laid-Open No. 2002-216947 cannot prevent external light from reflecting on the surface of the micro lens, an effect of preventing the external light from reflecting cannot be sufficiently obtained.

The organic EL element disclosed in Japanese Patent Application Laid-Open No. 2004-070094 cannot sufficiently prevent the reflection of external light incident from an oblique direction.

SUMMARY OF THE INVENTION

An object of the present invention is to provide an organic light emitting device capable of maintaining sufficient light extraction from a light emitting element and reducing reflection of external light.

An organic light emitting device of the present invention including: a substrate; an organic light emitting element arranged on the substrate, including a pair of electrodes and an organic compound layer arranged between the pair of electrodes; a phase member arranged on a light extraction side of the organic light emitting element; a prism member arranged on a light extraction side of the phase member; and a polarizing member arranged on a light extraction side of the prism member.

In the organic light emitting device of the present invention, the polarizing member, the prism member, the phase member and the organic light emitting element are arranged, in mentioned order from the side of a light extraction surface. In the organic light emitting element having such structure, the reflection of the external light can be reduced by the polarizing member and the phase member. Also, the efficiency of light extraction can be enhanced by the prism member. Furthermore, the polarizing member, the prism member and the phase member are arranged, in mentioned from the side of the light extraction surface, whereby it is possible to obtain excellent emitted light without affection of the prism member on the reduction of the reflection of the external light.

Thus, according to the organic light emitting device of the present invention, sufficient light extraction can be maintained and the reflection of the external light can be reduced.

Further features of the present invention will become apparent from the following description of exemplary embodiments with reference to the attached drawings.

DESCRIPTION OF THE EMBODIMENTS

Figure 1A:
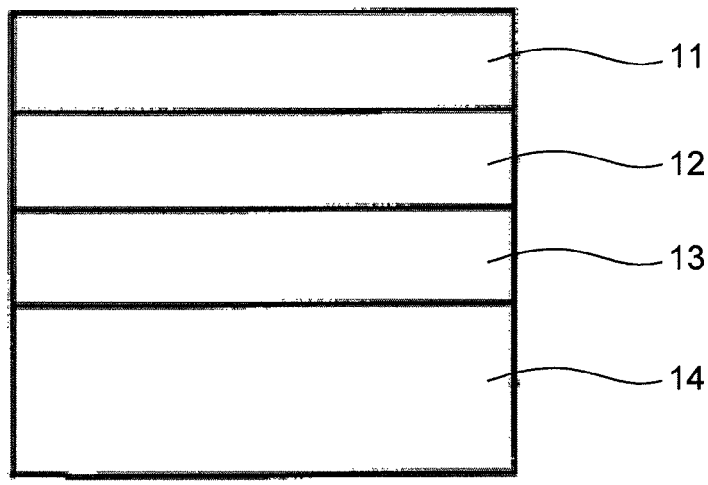
FIGS. 1A and 1B are a schematic longitudinal sectional view and a three-dimensional conceptual view of an organic light emitting device according to an embodiment of the present invention, respectively.

Hereinafter, an embodiment of the organic light emitting device and display device of the present invention will be described. The organic light emitting device and display device of the present invention are not limited to the embodiment to be described below.

In the organic light emitting device according to the embodiment of the present invention, a polarizing member, a prism member, a phase member and an organic light emitting element are arranged, in this order from the side of a light extraction surface. The display device according to the embodiment of the present invention includes a plurality of organic light emitting elements. Herein, the display device can have a rectangular display area, and the prism member is preferably arranged so that the longitudinal direction of the display device and the pitch direction of the prism member arranged on the side of the light extraction surface are orthogonal to each other.

Next, members which constitute the organic light emitting element according to the embodiment of the present invention will be described.

The organic light emitting element means a stacked body provided with an organic light emitting layer arranged between a pair of electrodes.

The polarizing member means a member which has a function for extracting linear polarized light oscillating only in a predetermined direction from light oscillating in all directions. For example, a member obtained by adsorbing and orienting a dichroic dye such as iodine on a polyvinyl alcohol film uniaxially stretched is used as the polarizing member.

The phase member means a member which has a function for compensating phase difference by applying the phase difference to light polarized by the polarizing member. The phase member of this embodiment applies the phase difference of about $1/4\lambda$, and has a function of converting the linear polarized light into a circular polarized light and converting the circular polarized light into the linear polarized light. A uniaxially stretched orientation film made of, for example, polycarbonate can be used as the material of the phase member.

Generally, a member obtained by combining the polarizing member and the phase member is referred to as circularly polarizing member, and the reflection of light incident from the outside can be prevented by the polarizing member and the phase member.

The prism member means a light-transmissive member having a plurality of convex parts provided on a surface thereof opposite to a surface in contact with the light extraction surface of the organic light emitting element. The shape of the convex parts of the prism member is preferably a pyramid, a truncated pyramid and a triangular prism.

When the convex parts are formed into the pyramidal shape, it is expected that the condensing effect in the light extraction direction is large. On the other hand, there is a problem that production of a mold for forming a sheet and a sheet manufacturing process become difficult.

On the other hand, since the prism member having the convex parts formed into the triangular prism shape has been already commercialized as a luminance increasing film for a backlight, the prism member can be advantageously introduced at a low cost.

Plumb-like objects and triangular prisms are paved so that the height of the convex part and the shape of a bottom surface are optimized and the inclination of the convex part surface becomes close to a predetermined angle. Specifically, the shape of the convex part is set to have a base of about 1 μm to 100 μm and a height of about 0.1 μm to 200 μm. For the inclination angle of the convex part surface, the vertex angle of the plumb-like object and triangular prism can be set to about 30° to 160°.

Herein, the pitch size of the convex part is preferably 1 μm or more in order that the member is not colored under the influence of diffraction. Also, when the display device using the organic light emitting element is observed, the size (usually about 100 μm) which does not exceed the pixel pitch is preferable in order not to feel the blot of the image.

Figure 8A:
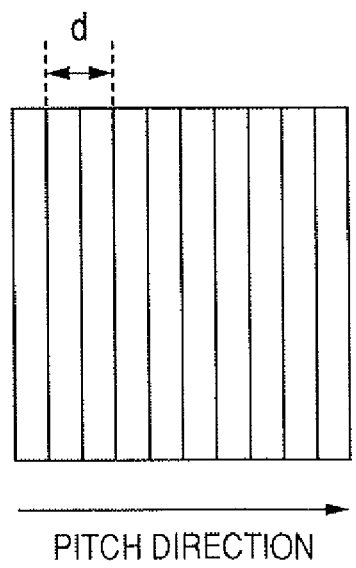
FIGS. 8A and 8B are conceptual views in a state that a prism member is viewed from the upper surface.
Figure 8B:
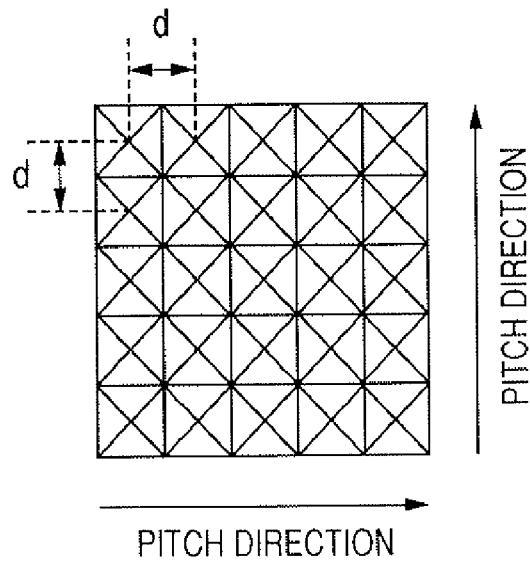

The pitch means a distance between the peaks of adjacent convex parts. The pitch of the prism member will be described with reference to FIGS. 8A and 8B. FIGS. 8A and 8B are conceptual views in a state where the prism member is viewed from the upper part thereof. The pitch is shown by reference character d in FIGS. 8A and 8B. Also, the pitch direction means a linear direction of connecting the peaks of adjacent convex parts as shown in FIGS. 8A and 8B. As shown in FIG. 8A, in the case of the prism member which has the convex part having the triangular prism shape, the pitch direction is one direction. However, in the case of the prism member which has the convex part having the pyramid shape or the truncated pyramid shape as shown in FIG. 8B, the pitch direction is two directions.

In order to produce this prism member, a convex pattern is formed using a transparent sheet. As the sheet material, there can be used polymethylmethacrylate (PMMA), polycarbonate (PC) triacetylcellulose (TAC) and glass. The refractive index of each of the sheet materials is about 1.49 to 1.57, and is almost the same value.

In order to form the convex part, first, a resist convex pattern is formed using photolithography, and the convex pattern is transferred using electrocasting to produce a concave mold. Next, a convex part pattern can be obtained by heating and compression molding the transparent sheet using this concave mold. Or after the convex pattern is transferred on the sheet using a photocurable resin, the convex pattern may be formed by a process for ultraviolet curing this photocurable resin.

A mold of a cylinder may be used in order to produce a triangular convex pattern sheet used as the luminance increasing film for the backlight for liquid crystals. In the specific production process, first, a predetermined groove-concave pattern is cut and formed by a diamond cutting tool while a cylinder subjected to a surface flat processing with using copper plating is rotated. Next, a convex pattern is formed in manner of printing using this cylinder. That is, the convex part pattern made of the photocurable resin is transferred onto a transparent sheet surface while putting the photocurable resin in the groove-concave pattern of the cylinder and rotating the cylinder. Next, the convex part pattern is irradiated with ultraviolet rays to cure the convex part pattern. Even when the thickness of a transparent sheet member is reduced to several micrometers, this method can obtain an excellent convex part pattern shape, and has an advantage that both the mold and the prism member can be produced at a low cost.

Figure 1B:
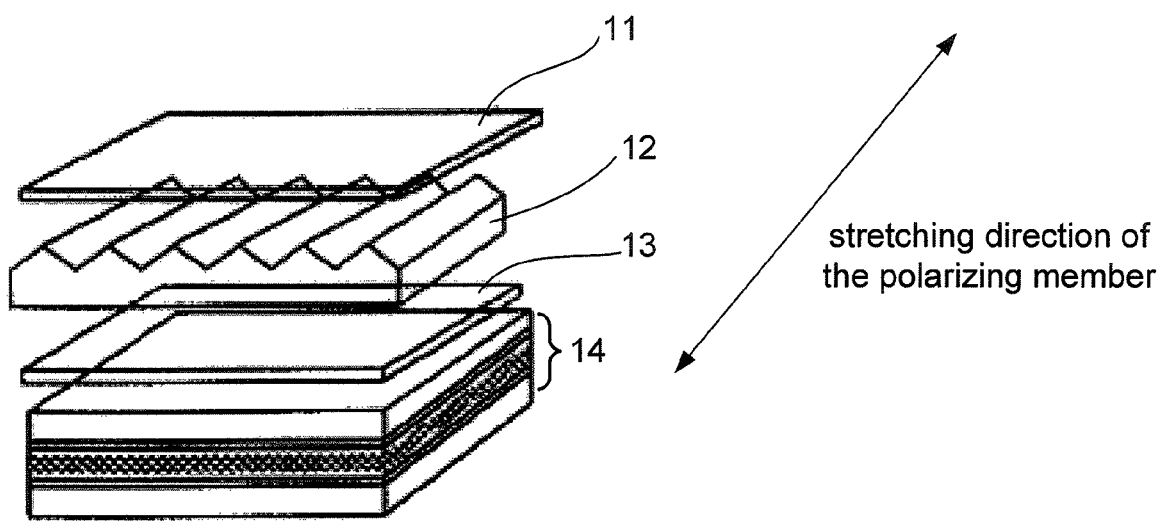

Hereinafter, an organic light emitting device according to an embodiment of the present invention will be described with reference to the drawings. FIGS. 1A and 1B illustrate schematically an organic light emitting device according to an embodiment of the present invention. FIG. 1A is a schematic longitudinal sectional view thereof, and FIG. 1B is a three-dimensional conceptual view thereof.

As shown in FIGS. 1A and 1B, the organic light emitting device according to the embodiment of the present invention includes a polarizing member 11, a prism member 12, a phase member 13 and an organic light emitting element 14, which are arranged in mentioned order from the side of a light extraction surface. As shown in FIG. 1B, the organic light emitting element 14 includes a pair of electrodes and an organic light emitting layer arranged between the pair of electrodes.

In this organic light emitting device, when emitted light from the organic light emitting element 14 transmits the prism member 12, the emitted light is refracted on the prism surface, and is condensed in the front direction. Then, the emitted light transmits the polarizing member 11, and is extracted in the observation direction.

On the other hand, external light entering from the light extraction surface of the organic light emitting device is passed through the polarizing member 11. In this case, linear polarized light oscillating only in a predetermined direction is passed, and the passed polarized light components transmit the prism member 12. After the polarized light components are passed through the phase member 13 and are converted into circular polarized light, the polarized light components are reflected on a reflective electrode of the organic light emitting element 14. The rotation direction of the circular polarized light is reversed in the reflection. This reflection light is passed through the phase member 13 again, and is converted into the linear polarized light which is orthogonal to the linear polarized light passed through the polarizing member 11 first. After the linear polarized light transmits the prism member 12, the linear polarized light is incident to the polarizing member 11. However, since this linear polarized light is absorbed by the polarizing member 11, the external light which enters from the outside of the light extraction surface of the organic light emitting device is not finally extracted in the observation direction, and thereby the antireflection effect for the external light can be exhibited.

The external light which enters from the outside of the light extraction surface of the organic light emitting device, and passes through the polarizing member 11 is partially reflected on the prism member 12. However, since the reflected light is absorbed by the polarizing member, the light is not extracted in the observation direction, and thereby the antireflection effect for the external light can be exhibited. That is, since the polarizing member 11, the prism member 12 and the phase member 13 are arranged in mentioned order from the side of the light extraction surface in the organic light emitting device of this embodiment, the light reflected on the prism member 12 is absorbed by the polarizing member 11, and the antireflection effect for the external light is not reduced.

Although the organic light emitting device includes one prism member is described in this embodiment, the organic light emitting device may include a plurality of prism members, and for example, the organic light emitting device can use two prism members. When the organic light emitting device includes the plurality of prism members, it is preferable that the prism members are stacked.

Also, the organic light emitting element can use known element constitutions and element materials suitably. Particularly, the embodiment of the present invention uses a top emission element which extracts light from the side of an upper electrode as the organic light emitting element.

Figure 2:
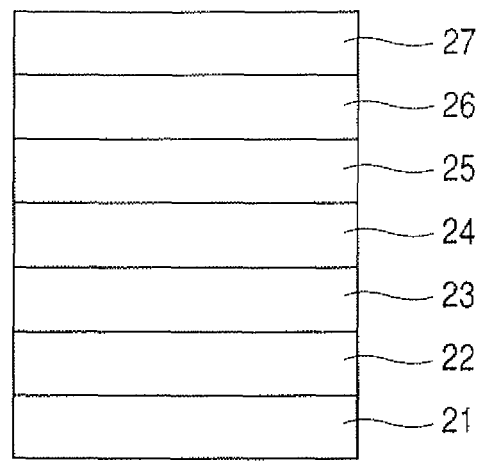
FIG. 2 is a longitudinal sectional view illustrating the structure of an organic light emitting element according to an embodiment of the present invention.

FIG. 2 is a longitudinal sectional view showing the structural example of an organic light emitting element according to an embodiment of the present invention.

This organic light emitting element is obtained by forming an organic EL film on a substrate 21 on which a drive circuit and the like are previously provided by vacuum deposition.

A metal anode electrode 22 composed of Cr and having a size of 100 μm square is previously formed in a thickness of 50 nm at a pitch of 200 μm and in a two-dimensional pattern on the substrate 21. Al and Ag having high reflectance other than Cr may be used as an anode electrode material. A transparent conducting film such as ITO and IZO can be stacked on the metal anode electrode 22 in order to enhance a hole injection property.

Hereinafter, the manufacturing process of the organic light emitting element will be described. In order to manufacture the organic light emitting element, first, α-NPD which is an organic EL material is stacked in a thickness of 20 nm as a hole transport layer 23. Next, Alq3 is stacked in a thickness of 30 nm as a light emitting layer 24. Next, a mixed film made of cesium carbonate and Alq3 is stacked in a thickness of 50 nm as an electron injection layer 25.

Next, the organic light emitting element is manufactured by stacking an ITO film as a transparent cathode electrode 26 in a thickness of 60 nm using a spatter method.

It is known that the EL emitted light of Alq3 molecules is generated at the interface between the hole transport layer 23 and the Alq3 light emitting layer 24 in this element constitution.

A SiN film can be stacked as a transparent protective film 27 in a thickness of 640 nm on the surface of the cathode electrode 26 by the spatter method. Moisture from the outside can be prevented from entering into the organic layer by arranging this transparent protective film 27.

For example, as disclosed in Japanese Patent Application Laid-Open No. H11-097169, an oxide, nitride and sulfide material films which primarily contain silicon, boron and germanium are suitable as the transparent protective film 27. The thickness having an effect for blocking oxygen and moisture is about 300 nm to 10 μm. In view of reducing film stress and shortening film formation time to enhance productivity, the thickness of the transparent protective film 27 is desirably about 300 nm to 5 μm.

Hereinafter, specific examples of the organic light emitting device of the present invention will be described with reference to the drawings.

Figure 9:
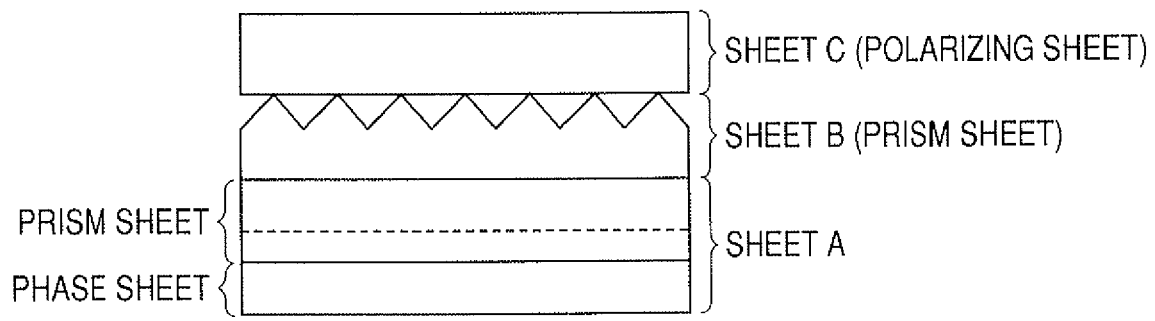
FIG. 9 is a schematic longitudinal sectional view of the prism member, the polarizing member and the phase member in example of the present invention.
Figure 10:
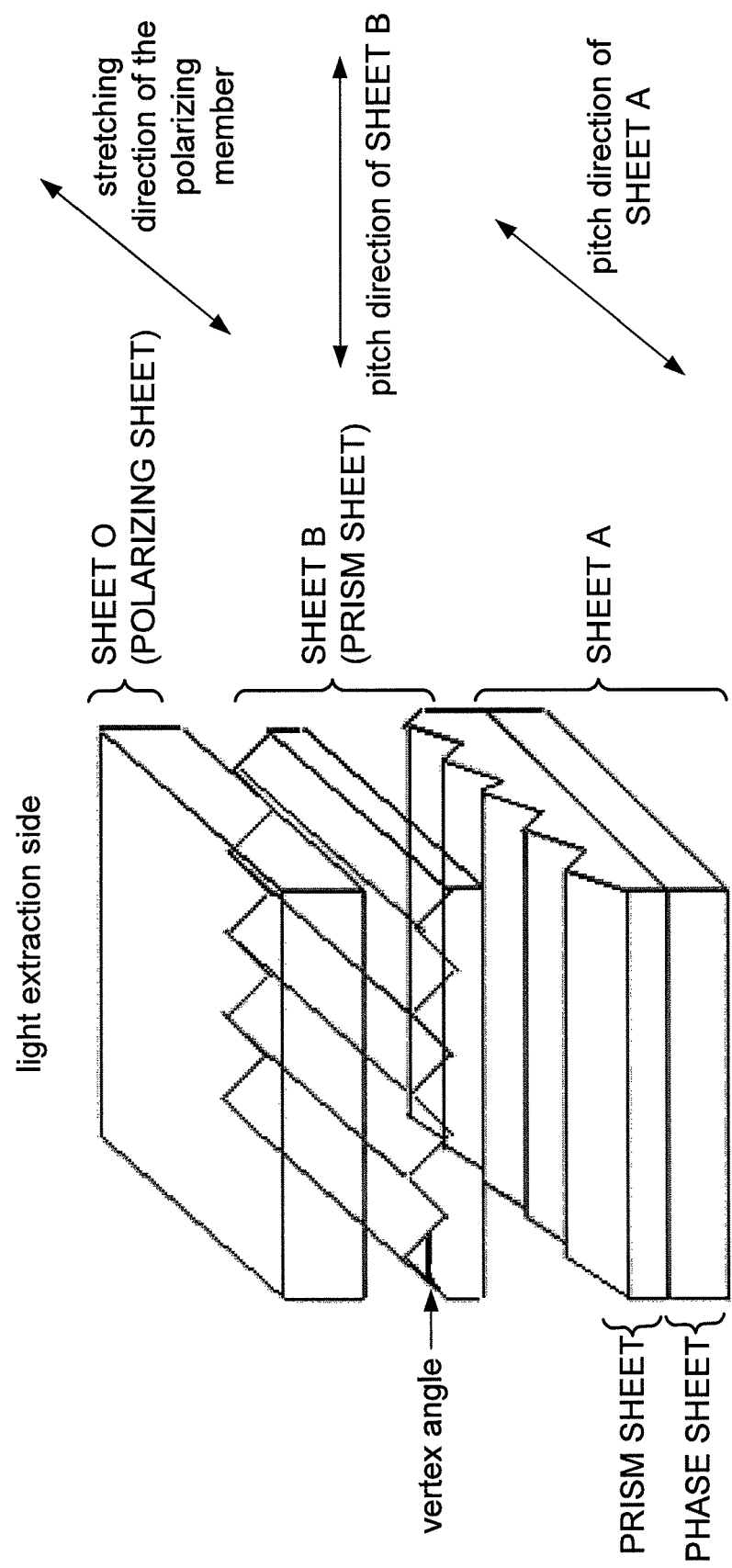
FIG. 10 is a three-dimensional oblique view of the prism member, the polarizing member and the phase member illustrated in FIG. 9.

FIG. 9 illustrates a schematic sectional view of the prism member, polarizing member and phase member in specific example of the organic light emitting device of the present invention. The organic light emitting device of this example includes two prism members.

<Bonding of Prism Member, Polarizing Member and Phase Member>

First, the bonding of the prism member, the polarizing member and the phase member will be described.

In this example, a triangular prism pattern having a vertex angle of 45° and a pitch of 15 μm was formed on a reverse wavelength dispersing phase plate (manufactured by SANRITZ CORPORATION: a sheet having a thickness of 70 μm) to make a sheet A. That is, the sheet A is obtained by stacking the prism member and the phase member.

Similarly, a triangular prism pattern having a vertex angle of 90° and a pitch of 15 μm was formed using a cylinder mold to make a sheet B. This triangular prism pattern is formed by transferring an acrylic photocurable resin on a TAC sheet having a thickness of 50 μm and by ultraviolet curing the resin. This sheet B is equivalent to the prism member.

The polarizing member (manufactured by SANRITZ CORPORATION: a sheet having a thickness of 100 μm) was prepared to make a sheet C.

The sheet C was superposed on the sheet B. In this case, the sheet B and the sheet C was superposed so that the stretching direction of the polarizing member is orthogonal to the prism pitch direction of the sheet B and so that the uneven surface of the sheet B is placed on the side of the polarizing sheet C. Therefore, when the sheet B and the sheet C are superposed, interference fringes of the polarizing member and prism surface are hardly viewed from the side of the polarizing member. The term "orthogonal" in this example means that the angle between the stretching direction of the polarizing member and the prism pitch direction of the sheet B may not be strictly 90°, and an error of about 20° may exist.

Next, the sheet A was superposed on the side of the sheet B of the superposed sheets B and C.

In this case, the sheet A was superposed on the superposed sheets B and C so that the prism pitch direction of the sheet A was orthogonal to the prism pitch direction of the sheet B and so that the uneven surface of the sheet A was placed on the side of the sheet B. Thus, the sheet B, the sheet C and the sheet A superposed to become bonded sheets. The term "orthogonal" in this example means that the angle between the prism pitch direction of the sheet A and the prism pitch direction of the sheet B may not be strictly 90°, and an error of a few degrees may exist.

In order to produce the bonded sheets (A, B, C), an adhesive layer previously may be provided on each of the sheets, and the sheets may be adhered by pressure. Or the adhesive layer may be heated and adhered by pressure under a reduced pressure environment.

In the case of one prism member, the bonded sheets (B, C) to which the sheet A is not added and in which only the sheet B exists are produced. In this case, the base material of the sheet B is used for the phase member, or the phase member is inserted into the side of the organic light emitting element. When the prism member as a third or following member is added, the prism member needs only to be newly added to the side of the organic light emitting element similarly.

<Bonding of Organic Light Emitting Element and Stacked Sheet>

The organic light emitting element of this example is formed by bonding the organic light emitting element and the bonded sheets. When the organic light emitting element and the bonded sheets are bonded, it is preferable to superpose the organic light emitting element and the stacked sheets as described below. The term "panel" in the following description means a display device which has a display part having a plurality of organic light emitting elements, and this panel has a rectangular shape.

When the main observation direction of the display device is decided, the display device and the bonded sheets are bonded so that the prism pitch direction of the sheet B is orthogonal to the transverse direction of the panel. Usually, in the case of a horizontally long rectangular panel, the longitudinal direction is observed as the transverse direction, viewed from the front. The term "orthogonal" in this example means that the angle between the prism pitch direction of the sheet B and the transverse direction of the panel may not be strictly 90°, and an error of about 20° may exist.

<Mechanism and Operation for Enhancing Luminance>

Figure 3:
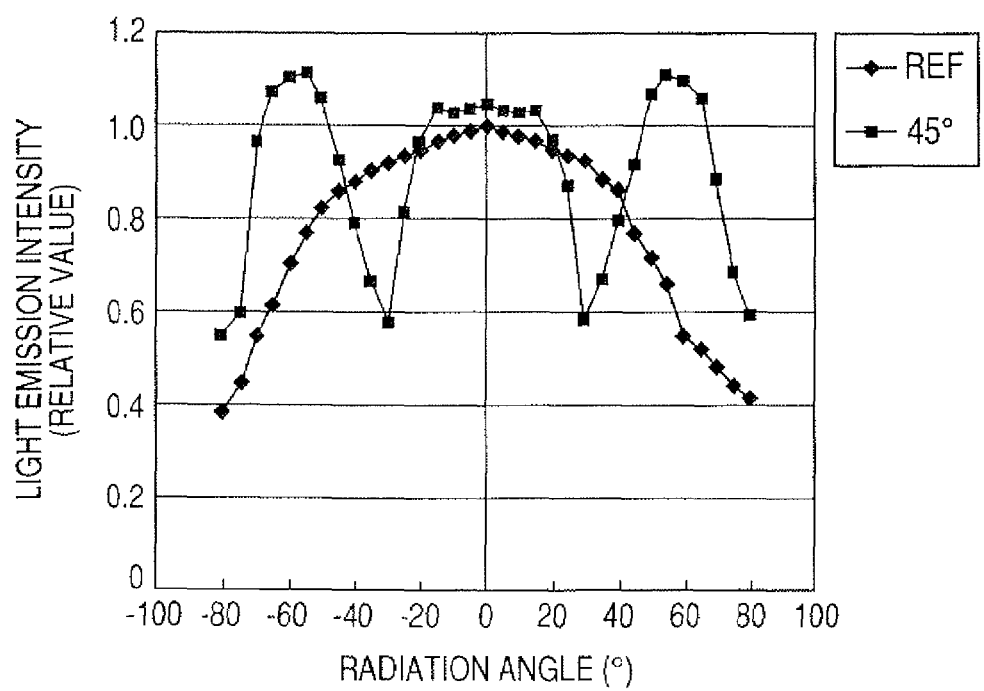
FIG. 3 is a radiation angle property diagram of the light intensity of emitted light extracted from an organic light emitting device having a stacked prism member with a vertex angle of 45°.

Next, the reason why front luminance is improved will be described in the organic light emitting device of this example with reference to FIG. 3. FIG. 3 illustrates the angle dependence property of emitted light intensity extracted from the organic light emitting device in which prism members having a vertex angle of 45° are bonded.

As described above, the amount of the light extracted to the outside from the light extraction surface of the organic light emitting device is limited in the conventional technique. That is, since the surface of the phase member (equivalent to the sheet A of this example) is a plane in the conventional technique, light components which are totally reflected on the surface of this phase member and cannot be extracted exist. On the other hand, since the prism surface having a vertex angle of 45° is provided on the upper part of the sheet A (reverse wavelength dispersing phase plate) in this example, the light components can be extracted including the light which cannot be extracted in the conventional technique. Therefore, in this example, the light components emitted in the vertical direction are increased as compared with the conventional technique.

FIG. 3 shows the relationship between the light emitting characteristic and the emitted light intensity. The relationship is obtained by adhering the sheet A on the organic light emitting element using optical oil (silicone grease: manufactured by NISSHO SANGYO CO., Ltd.), and measuring and evaluating the angle dependence of emitted light intensity thereof using a light emitting characteristic evaluation device (EL-1003) manufactured by Precise Gauge Co., Ltd. The front direction is set at the radiation angle of 0° in FIG. 3.

In the organic light emitting device obtained by bonding the prism members having the vertex angle of 45°, the emitted light intensity is increased at the angle of about 60°. That is, the intensity integrated at the total radiation angle is increased by about 15% as compared with an REF element in which the stackion is not conducted. When the conventional organic light emitting device is used, the surface of the phase member is a plane, and thereby the light components which are totally reflected on the surface of the phase member and cannot be extracted exist. However, this example shows that the light can be extracted including the light components.

Table 1 shows investigation results for the angle dependence of the emitted light intensity in changing the vertex angle of the prism from 20° to 170°.

TABLE 1

| Vertex angle (°) | Front intensity ratio | Peak intensity ratio in the oblique direction | Integration intensity rate (%) |
|---|---|---|---|
| 20 | 0.80 | None | 85 |
| 30 | 0.90 | 0.5 | 105 |
| 40 | 1.00 | 1.2 | 115 |
| 50 | 1.10 | 1.0 | 120 |
| 60 | 1.10 | 1.0 | 130 |
| 70 | 1.30 | 0.7 | 120 |
| 80 | 1.40 | 0.3 | 110 |
| 90 | 1.50 | 0.3 | 85 |
| 100 | 1.40 | 0.2 | 80 |
| 110 | 1.40 | 0.1 | 90 |
| 120 | 1.40 | 0.3 | 90 |
| 130 | 1.20 | 0.3 | 95 |
| 140 | 1.10 | 0.1 | 95 |
| 150 | 1.00 | None | 95 |
| 160 | 1.00 | None | 95 |
| 170 | 1.10 | None | 95 |

As is apparent from Table 1, when the vertex angle of the prism is about 30 to 80°, the peak of the emitted light intensity which is considered to be equivalent to the light components which was not conventionally extracted by total reflection is viewed at the radiation angle at about 60 to 80°. Also, the intensity which is integrated at the total radiation angle is also increased by about 5 to 30% as compared with the REF element in which the prisms are not stacked.

Also, when the vertex angle is larger than 50°, the emitted light intensity in the front direction is increased. However, when the vertex angle exceeds 120°, the emitted light intensity in the oblique direction is largely reduced. Furthermore, when the vertex angle exceeds 150°, the characteristic of the element approaches to that of the REF element in which the prisms are not stacked. Also, the intensity integrated at the total radiation angle is the same as, or slightly smaller than that of the flat REF element in which the prisms are not stacked.

Then, it turns out that the vertex angle of the prism of the sheet A is preferably about 30 to 80° wherein the integration intensity ratio is larger than the flat surface (Ref) in view of the enhancement of light extraction efficiency.

Also, even when the vertex angle of the prism is 100° to 140°, an effect that the components of the light emitted in the front direction is larger than the flat surface (Ref) can be confirmed including the light which is totally reflected on the surface of the phase member and cannot be extracted as the conventional technique. That is, the integration intensity ratio is not less than 100%, and the front intensity ratio also exceeds 1.

The emitted light which transmits the sheet A is incident to the sheet B, transmits the prism surface having a vertex angle of 90°, and is incident to the sheet C (polarizing member).

For example, when the light from the organic light emitting element transmits the prism surface having the vertex angle of 90°, the light is efficiently condensed in the front direction.

Figure 4:
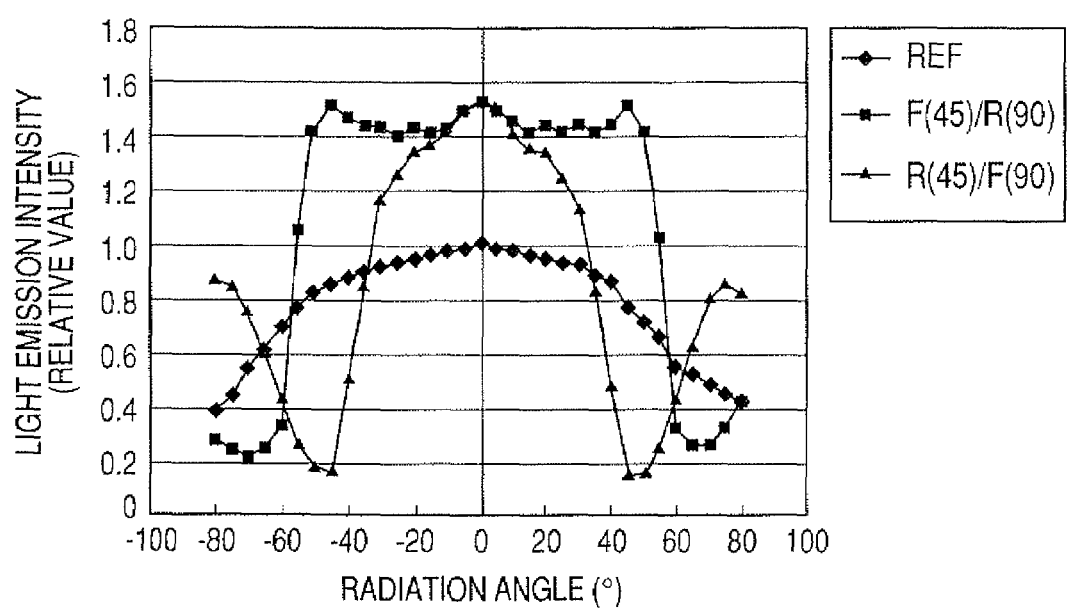
FIG. 4 is a radiation angle property diagram of organic light emitting devices having stacked prism members with vertex angles of 45° and 90°.

Next, with reference to FIG. 4, the angle dependence property of the emitted light intensity extracted from the prism surface of 90° of the sheet B when the sheet B is superposed on the sheet A having the vertex angle of the prism of 45° will be described. FIG. 4 illustrates the angle dependence property of the emitted light intensity extracted from the prism surface of 90° of the sheet B when the sheet B is superposed on the sheet A having the vertex angle of the prism of 45°.

FIG. 4 illustrates the results obtained by adhering the sheet A on which the sheet B is superposed on the organic light emitting element using optical oil (silicone grease: manufactured by NISSHO SANGYO CO., Ltd.), and measuring and evaluating the angle dependence of an emitted light intensity thereof using a light emitting characteristic evaluation device (EL-1003) manufactured by Precise Gauge Co., Ltd. In the surface of the sheet A having the vertex angle of the prism of 45°, the emitted light was efficiently extracted in the direction where the radiation angle is 60° or less. It turns out that the emitted light is efficiently turned in the front direction on the bottom surface of the sheet B having the vertex angle of the prism of 90°.

As a result, the case where the sheet A and the sheet B are superposed on the organic light emitting element, the front emitted light intensity is increased by about 1.5 times as compared with the case of only the organic light emitting element.

In order to realize a display device having excellent viewing angle characteristic, the light which transmits the sheet A and the sheet B must show the angle characteristic that the intensity is large in the oblique direction.

As is apparent from Table 1, when the vertex angle is larger than 50°, the emitted light intensity in the front direction is increased. However, when the vertex angle exceeds 120°, the emitted light intensity in the oblique direction is largely reduced. Also, when the vertex angle exceeds 150°, the characteristic of the element approaches to that of the flat REF element in which the prisms are not stacked. Also, the intensity integrated at the total radiation angle is the same as, or slightly smaller than that of the flat REF element in which the prisms are not stacked.

Then, it turns out that the vertex angle of the prism of the sheet B is preferably about 50 to 140°, wherein the front intensity ratio is larger than the flat surface (Ref) in view of the enhancement of the light extraction efficiency. Furthermore, the vertex angle of the prism of the sheet B is preferably about 65° to 140°, and more preferably about 65° to 130°.

When the main observation direction of the organic light emitting device is decided, the organic light emitting element and the bonded sheet are preferably bonded so that the prism pitch direction of the sheet B is orthogonal to the transverse direction of the panel. The term "orthogonal" in this example means that the angle between the prism pitch direction of the sheet B and the transverse direction of the panel may not be strictly 90°, and an error of about 20° may exist.

In FIG. 4, a graph shown by F(45)/R(90) shows the organic light emitting element and the bonded sheets which are bonded in a preferable direction. On the other hand, the case where the organic light emitting element and the bonded sheets are bonded so that the prism pitch direction of the sheet A is mostly orthogonal to the transverse direction of the panel is equivalent to the graph shown by R(45)/F(90).

In the case where the organic light emitting element and the bonded sheets are bonded so that the prism pitch direction of the sheet A is mostly orthogonal to the transverse direction of the panel (the graph shown by R(45)/F(90), the front light intensity is almost the same as that of the case (the graph shown by F(45)/R (90)) where the organic light emitting element and the stacked sheets are stacked so that the prism pitch direction of the sheet A is parallel with the transverse direction of the panel. However, it turns out that the light intensity in the oblique direction is largely reduced and the display device is unsuitable. When the display device is obliquely observed in the vertical direction, the relationship shown in FIG. 4 becomes opposite.

When the results described above are summarized, the sheet A has a large effect for extracting the emitted light to the outside of the organic light emitting element on the prism surface having the vertex angle of 30 to 80°. Also, an effect for extracting the emitted light emitted from the prism surface of the sheet A in the front direction is expected in the sheet B. Herein, the combination in which the vertex angle is 65 to 130° is preferable.

When a display device has the organic light emitting element having a plurality of pixels and the pixels has a rectangular shape, the interference fringes of an image electrode pattern and prism pattern may be viewed. When the prism sheet is arranged so that the longitudinal direction of the pixel corresponds to the pitch direction of the prism sheet B arranged on the side of the light extraction surface, the interference fringes are not easily viewed. When the pitch direction of the prism sheet B arranged on the side of the light extraction surface is orthogonal to the longitudinal direction of the pixel in the design of the pixel arrangement of the display device, the prism sheet B is stacked so that the pitch direction of the prism sheet B is inclined by 20° or more from the orthogonal direction. Therefore, the interference fringes are not emphasized.

<Mechanism and Operation for Enhancing Antireflection of External Light>

The emitted light which transmits the sheet B is incident to the sheet C, and is extracted to the outside as the polarized light. On the other hand, the external light which is incident from the outside of the light extraction surface of the organic light emitting device is passed through the sheet C (polarizing plate). Herein, it is preferable to select the polarizing plate to which only P-polarized light components is incident as the sheet C (polarizing plate). The P-polarized light means linear polarized light having a light oscillating surface parallel with an incident surface. Also, the S-polarized light means linear polarized light having a light oscillating surface vertical to the incident surface.

The polarized light components are incident to the prism surface of the sheet B. Since the prism surface is inclined, the effective incident angle of the external light is increased by superposition. For example, the external light which is incident from the front direction to the prism surface having the vertex angle of 60° is effectively incident obliquely at 60°. The external light is reflected on the prism surface a plurality of times, and is observed as the reflection of the external light. When the vertex angle of the prism is particularly smaller than 60°, the reflection of the external light is increased (the effective incident angle of the external light from the front direction is 60° or more, and the high reflection of the external light is shown.).

Conventionally, there was a technique for sequentially providing a circularly polarizing member and a prism member on an organic light emitting element to prevent the reflection of external light using the operation of the circularly polarizing member. Also, there was a technique for sequentially providing a member having a prism structure and a circularly polarizing member on an organic light emitting element to prevent the reflection of external light using the operation of the circularly polarizing member. However, in these conventional techniques, limitation conditions exist for the antireflection effect for the external light. The present inventor confirmed that the antireflection effect for the external light was enhanced by dividing the polarizing member and the phase member and sandwiching the prism member therebetween, as in the organic light emitting element according to the present invention. Hereinafter, the enhancement in the antireflection effect for the external light will be described in detail.

Table 2 shows the calculation relationship of incident angle, reflectance and phase change in the reflection when the P-polarized light and the circular polarized light are incident to a plane having a refractive index of 1.5 from an air layer. Herein, the circular polarized light components are set as the average value of the P-polarized light and S-polarized light.

TABLE 2

| Incident angle (°) | P-polarized light reflectance (%) | P-polarized light phase change (°) | Circular polarized light reflectance (%) | Circular polarized light phase difference (°) |
| --- | --- | --- | --- | --- |
| 0 | 3.1 | 5.2 | 3.1 | 180.0 |
| 5 | 3.1 | 5.2 | 3.1 | 180.0 |
| 10 | 3.0 | 5.2 | 3.1 | 180.1 |
| 15 | 2.8 | 5.1 | 3.1 | 180.2 |
| 20 | 2.5 | 5.0 | 3.1 | 180.4 |
| 25 | 2.2 | 4.9 | 3.1 | 180.6 |
| 30 | 1.8 | 4.8 | 3.1 | 180.9 |
| 35 | 1.4 | 4.7 | 3.2 | 181.3 |
| 40 | 0.9 | 4.7 | 3.4 | 181.9 |
| 45 | 0.5 | 5.0 | 3.8 | 182.8 |
| 50 | 0.1 | 6.9 | 4.4 | 185.2 |
| 55 | 0.0 | 151.3 | 5.5 | 330.1 |
| 60 | 0.3 | 178.5 | 7.3 | 357.8 |
| 65 | 1.6 | 179.7 | 10.3 | 359.5 |
| 70 | 4.7 | 180.0 | 15.2 | 0.0 |
| 75 | 11.2 | 180.1 | 23.3 | 0.2 |
| 80 | 24.2 | 180.0 | 37.0 | 0.2 |
| 85 | 49.8 | 180.0 | 60.0 | 0.1 |

As is apparent from Table 2, when the external light is incident from the oblique direction, it turns out that the reflectance of the P-polarized light and circular polarized light tends to be increased. Then, since the rise of reflectance of the P-polarized light is smaller than that of the circular polarized light, it is preferable to select the P-polarized light in order to suppress the reflection of the external light in the sheet B (the reflectance of the P-polarized light is 3% or less at the incident angle of 65° or less).

When the reflection light from the sheet B transmits the polarizing plate of the sheet C and comes out of the display device, the reflection light superposes with the emitted light of the organic light emitting element to arise the reflection, and thereby the display quality is reduced. When the phase change in the reflection exceeds the incident angle of 55° in the P-polarized light, the phase is inverted, and the reflective polarized light to the sheet C is turned into the S-polarized light. The S-polarized light is absorbed to the polarizing plate, and the reflection of the external light does not take place. That is, the reflection on the interface between the prism member and the air is within 3% at all the incident angles. Furthermore, it is also easy to suppress the reflection of the external light within 1% by conducting an antireflection (AR) coat processing.

On the other hand, the reflectance of the circular polarized light which transmits the circularly polarizing member is about 5% at the incident angle of 55° or less. The phase of the circular polarized light is inverted in the reflection; the reflection light is not passed through the circularly polarizing member; and the reflection of the external light does not take place.

However, the incident light which exceeds the incident angle of 60° returns to the circularly polarizing member by high reflectance 10% or more. Since the phase change due to the reflection is not generated at this time, the absorption of the reflection light in the circularly polarizing member is not generated. Therefore, the constitution in which the circularly polarizing member is arranged on the light extraction surface can suppress the reflection of the external light from the panel front. However, it turns out that the reflection of the external light incident from the oblique direction is large and the constitution is not suitable for practical use.

When the circularly polarizing member is similarly stacked on the organic light emitting element and the prism member is provided on the light extraction surface, the reflection on the prism surface has the same reflectance characteristic as that of the circular polarized light. That is, when the incident angle is 55° or less, the reflectance is about 5%, and the incident light which exceeds the incident angle of 60° has high reflectance of 10% or more. In this case, since there is no antireflection effect for the external light due to the circularly polarizing member, the reflection of the external light due to the prism surface presents a large problem.

Actually, a display device using the organic light emitting element according to example of the present invention, a display device in which the circularly polarizing member was stacked on the prism member, and a display device in which the prism member was stacked on the circularly polarizing member were observed by comparison in bright light. The result confirmed that the prism member was not easily viewed in the organic light emitting element according to example of the present invention, and the prism member itself was viewed in the display device on which the circularly polarizing member was stacked.

The external light (P-polarized light) which transmits the sheet B is incident to the prism surface of the sheet A. Since this incident light is in a linear polarized light state, the polarized light state due to reflection and refraction is hardly changed. However, the influence of the reflection can be eliminated by providing an antireflection film which includes a dielectric multilayer film on the prism surface.

Furthermore, the external light (P-polarized light) is passed through a ¼λ phase plate, and thereby the external light is converted into the circular polarized light, and the circular polarized light is incident to the organic light emitting element. The external light reflected on a metal reflective electrode in the organic light emitting element is converted into reverse circular polarized light.

Furthermore, the external light converted into the circular polarized light is passed through the ¼λ phase plate of the sheet A, and thereby the external light is converted into the S-polarized light. The external light converted into the S-polarized light is passed through the sheet B, and is incident to the polarizing plate of the sheet C. Herein, since the polarizing plate absorbs the S-polarized light, the external light which is finally incident to the organic light emitting element is absorbed into the panel, and the reflection of the external light is suppressed.

<Distance between Prism Member Surface and Light Emitting Surface, Relationship with Pixel Pitch and Using Condition>

As described above, a uniform inclined surface is formed on the prism member. When the emitted light refracted and extracted on this inclined surface is observed from the front direction of the organic light emitting device, the emitted light in the inclined direction from the front is actually extracted out of the front by refraction, and thereby the emitted light is observed at a position where the emitted light is shifted from the actual pixel position.

Figure 5:
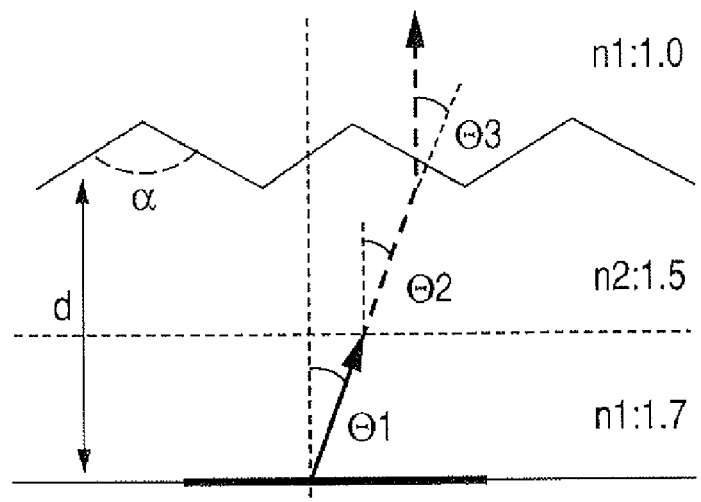
FIG. 5 is a schematic diagram showing a state that internal emitted light is refracted and extracted on a prism surface.

Herein, a condition where internal emitted light is refracted and is extracted on a prism surface will be described with reference to FIG. 5. FIG. 5 shows a condition where internal emitted light is refracted on a prism surface and is extracted.

As shown in FIG. 5, a case where emitted light inclined by θ1 to a light emitting surface (panel surface) has an inclination of θ2 in a prism member, and the emitted light is incident to a prism surface having a vertex angle α, and is refracted to be emitted to the air interface is considered.

When the refractive index of the light emitting layer, the refractive index of the prism member and the refractive index of the air layer are respectively set at n1 (assumed as 1.7), n2 (assumed as 1.5) and n3 (assumed as 1.0), the relationship of n1/n2=sin(θ1)/sin(θ2) is realized according to Snell's law.

Since the prism surface is inclined by (90+α/2)° to the light emitting surface, the emitted light is incident to the prism surface at the inclination angle of (α/2+θ2).

When the angle of the emitted light emitted to the air layer on the basis of the prism surface is set at θ3, the relationship of n2/n3=sin(α/2+θ2)/sin(θ3) is realized according to Snell's law.

Herein, the angle of the emitted light emitted to the air layer is set at the inclination angle θ4 based on the light emitting surface (panel surface), the angle is determined as θ4=θ3−(α/2).

Table 3 shows exit angle characteristic when internal emitted light is emitted from a smooth surface having no prism structure and a prism surface of 90°.

TABLE 3

| Internal emission angle (°) θ1 | Exit angle (°) for smooth surface θ4 | Exit angle (°) for 90° prism θ4 |
|---|---|---|
| 0 | 0 | −37 |
| 5 | 9 | −27 |
| 10 | 15 | −22 |
| 15 | 24 | −15 |
| 20 | 30 | −7 |
| 25 | 38 | 2 |
| 30 | 48 | 16 |
| 35 | 62 | 22 |
| 40 | 75 | 31 |
| 45 | — | 38 |
| 50 | — | 45 |
| 55 | — | 52 |
| 60 | — | 61 |
| 65 | — | 67 |
| 70 | — | 74 |
| 75 | — | 84 |
| 80 | — | — |
| 85 | — | — |

As is apparent from Table 3, the emitted light having the incident angle larger than a critical angle of about 40° cannot be emitted to the air layer in emitting from the smooth surface having no prism structure as conventionally known. On the other hand, great mass of internal emitted light can be extracted in the prism member having the vertex angle of 90° (however, considered excluding the reflection). In this case, the internal light emitting components inclined by about 25° are extracted out of the front of the panel by refraction. For example, when the distance d between the light emitting surface and the prism surface is 100 μm, the emitted light which is originally viewed at the front is deviatory viewed by d×cos(25°)=100×0.43=43 μm in the transverse direction.

Figure 6:
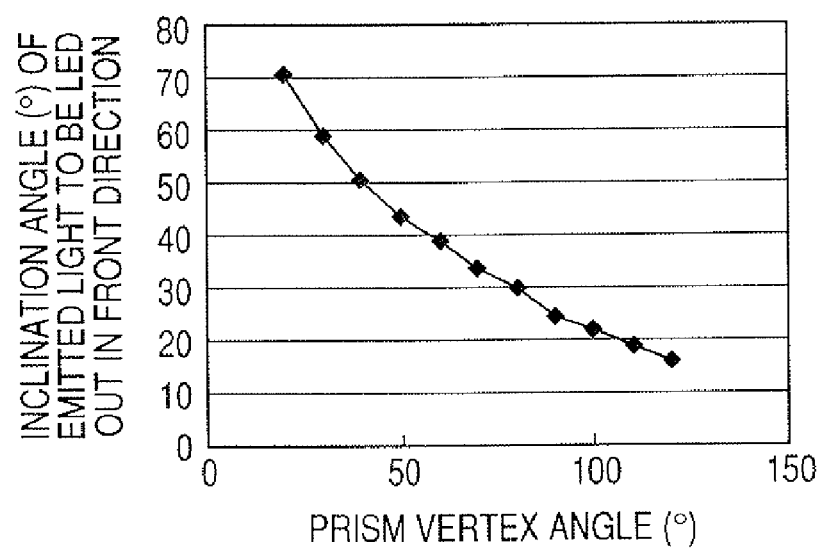
FIG. 6 is a graph showing a relationship between the vertex angle of a prism and the inclination angle (°) of emitted light extracted out of the front.

Next, with reference to FIG. 6, the relationship between the vertex angle of a prism and the inclination angle (°) of emitted light extracted out of the front will be described. FIG. 6 illustrates the relationship between the vertex angle of the prism and the inclination angle of emitted light extracted out of the front. FIG. 6 illustrates the relationship between the vertex angle of the prism and the inclination angle (the front direction is set at 0°) of the emitted light refracted and extracted out of the front of the panel.

As is apparent from FIG. 6, the smaller (sharper) the prism angle is, the emitted light inclined to the front direction of the panel is observed in the front direction.

Figure 7:
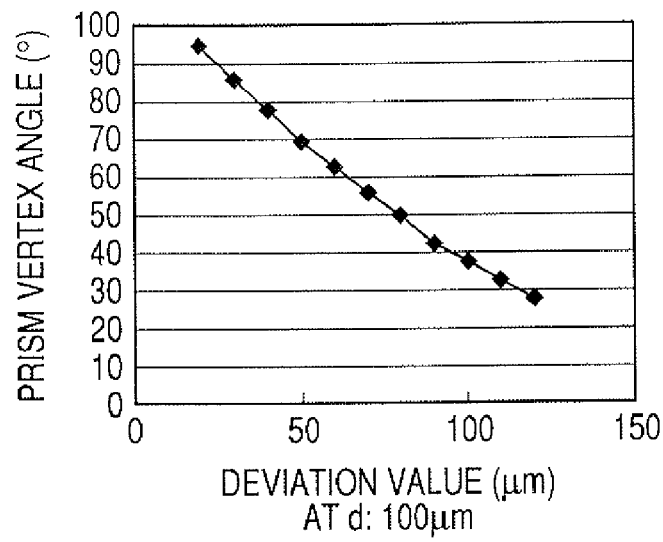
FIG. 7 is a graph showing a relationship between the vertex angle of a prism and the deviation of a light emitting part in a transverse direction.

Next, with reference to FIG. 7, the relationship between the vertex angle of a prism and the deviation of a light emitting part in a transverse direction will be described. FIG. 7 illustrates the relationship between the vertex angle of a prism and the deviation of a light emitting part in a transverse direction. FIG. 7 illustrates the relationship between the deviation (μm) of the light emitting part, which was observed in the front direction of the panel in the transverse direction when the distance d between the light emitting surface and the prism surface is set to 100 μm, and the vertex angle of the prism.

When the vertex angle of the prism is 100° or more, the deviation of the emitted light is about 10 to 20%, and can be said to be comparatively few. However, as is apparent from FIG. 7, when the vertex angle of the prism is 70° or less, the deviation of the emitted light is 50% or more, and the deviation of the emitted light is remarkable.

Now, the pixel pitch of the display device used in the market is often about 100 μm. Herein, when the deviation of the light emitting part has a size exceeding the pixel pitch, the deviation is observed as the blot of the image, and the quality of image is reduced.

Then, the deviation must be suppressed by selecting the distance d between the light emitting surface and the prism surface and the vertex angles of the combined prism members.

Although the distance between the light emitting surface and the prism surface (the vertex angle of 45°) of the sheet A was about 100 μm or less and the distance to the prism surface (the vertex angle of 90°) of the sheet B was about 170 μm or less in the prism member of this example, the blot of the image was not observed. On the other hand, the blot of the image was clearly observed when an acrylic resin sheet having a thickness of 500 μm was sandwiched between the sheet A and the organic light emitting element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-097176, filed Mar. 31, 2006, which is hereby incorporated by reference herein in its entirety.

What is claimed is:

1. An organic light emitting device comprising:
a substrate;
an organic light emitting element arranged on the substrate;
a phase member arranged on a light extraction side of the organic light emitting element;
a first prism member arranged on a light extraction side of the phase member;
a second prism member arranged on a light extraction side of the first prism member wherein the first and second prism members each have prism elements which have a convex part having a triangular shape toward the light extraction side and pitch directions of the first and second prism members are orthogonal to each other; and a polarizing member arranged on a light extraction side of the second prism member wherein the vertex angle of the convex part of the first prism member is 30° or more and 80° or less, and the vertex angle of the convex part of the second prism member is 65° or more and 140° or less.

2. The organic light emitting device according to claim 1, wherein a stretching direction of the polarizing member is orthogonal to a pitch direction of the second prism member.

3. The organic light emitting device according to claim 1, wherein the polarizing member transmits P-polarized light and absorbs S-polarized light.

4. The organic light emitting device according to claim 1, wherein the second prism member has an uneven surface subjected to an antireflection-coating process.

5. The organic light emitting device according to claim 1, wherein external light incident to the organic light emitting element and external light reflected by the organic light emitting element are circular polarized light.

6. The organic light emitting device according to claim 1, wherein light emitted from the organic compound layer is extracted from the side of the substrate.

7. A display device comprising:
a substrate;
a plurality of organic light emitting elements arranged on the substrate;
a phase member arranged on a light extraction side of the organic light emitting element;
a first prism member arranged on a light extraction side of the phase member;
a second prism member arranged on a light extraction side of the first prism member wherein the first and second prism members each have prism elements which have a convex part having a triangular shape toward the light extraction side and pitch directions of the first and second prism members are orthogonal to each other; and
a polarizing member arranged on a light extraction side of the second prism member
wherein the vertex angle of the convex part of the first prism member is 30° or more and 80° or less, and the vertex angle of the convex part of the second prism member is 65° or more and 140° or less.

8. The display device according to claim 7, wherein the display device has a rectangular display area; and a longitudinal direction of the display device is parallel with a pitch direction of the first prism member.

9. The organic light emitting device according to claim 1, wherein the vertex angle of the convex part of the first prism member is 40° or more and 60° or less.

10. The organic light emitting device according to claim 7, wherein the vertex angle of the convex part of the first prism member is 40° or more and 60° or less.

* * * * *